US012662065B2

(12) United States Patent
Carnevali et al.

(10) Patent No.: US 12,662,065 B2
(45) Date of Patent: Jun. 23, 2026

(54) DOCK WITH AIR FLOW ARRANGEMENT FOR HEATING/COOLING AN ELECTRONIC DEVICE AND METHODS OF MAKING AND USING

(71) Applicant: National Products, Inc., Seattle, WA (US)

(72) Inventors: Jeffrey D. Carnevali, Seattle, WA (US); Chad Michael Remmers, Vashon, WA (US)

(73) Assignee: National Products, Inc., Seattle, WA (US)

( * ) Notice: Subject to any disclaimer, the term of this patent is extended or adjusted under 35 U.S.C. 154(b) by 365 days.

(21) Appl. No.: 18/205,902

(22) Filed: Jun. 5, 2023

(65) Prior Publication Data

US 2024/0399976 A1 Dec. 5, 2024

(51) Int. Cl.
*B60R 11/02* (2006.01)
*B60R 11/00* (2006.01)
*H05K 7/20* (2006.01)

(52) U.S. Cl.
CPC ...... *B60R 11/0241* (2013.01); *H05K 7/20145* (2013.01); *B60R 2011/0008* (2013.01); *B60R 2011/0059* (2013.01); *B60R 2011/0071* (2013.01)

(58) Field of Classification Search
CPC ........... B60R 11/0241; B60R 2011/008; B60R 2011/0059; B60R 2011/0071; H05K 7/20145
USPC .......................................................... 454/237
See application file for complete search history.

(56) References Cited

U.S. PATENT DOCUMENTS

| | | | |
|---|---|---|---|
| 809,977 | A | 1/1906 | O'Brien |
| 1,786,459 | A | 12/1930 | Simons |
| 2,495,552 | A | 1/1950 | Schmitz |
| 2,549,917 | A | 4/1951 | Millbrandt |
| 2,565,939 | A | 8/1951 | Wriston |
| 2,612,947 | A | 10/1952 | Jenks |
| 2,717,093 | A | 9/1955 | Mautner |

(Continued)

FOREIGN PATENT DOCUMENTS

| | | |
|---|---|---|
| CN | 1312603 | 9/2001 |
| CN | 101674096 | 3/2010 |

(Continued)

OTHER PUBLICATIONS

U.S. Appl. No. 18/590,837, filed Feb. 28, 2024.

(Continued)

*Primary Examiner* — Steven B Mcallister
*Assistant Examiner* — Charles R Brawner
(74) *Attorney, Agent, or Firm* — Branch Partners PLLC; Bruce E. Black

(57) ABSTRACT

A dock for an electronic device includes a base configured to fit over at least a portion of a back surface of the electronic device; a tray extending from the base for receiving one side of the electronic device, wherein at least one of the base or tray includes an opening through the base or tray; and an air flow arrangement including a hose coupled, or coupleable, to the base or tray for air flow from the hose to pass through the opening in the base or tray and a vent adapter coupled, or coupleable, to the hose and configured for coupling to a vent of an air flow source.

18 Claims, 5 Drawing Sheets

(56)        References Cited

U.S. PATENT DOCUMENTS

| | | | |
|---|---|---|---|
| 2,803,368 A | 8/1957 | Koch |
| 3,018,525 A | 1/1962 | Deisenroth |
| 3,140,883 A | 7/1964 | Anthony |
| 3,464,579 A | 9/1969 | Asenbauer |
| 3,667,648 A | 6/1972 | Koziol |
| 3,808,577 A | 4/1974 | Mathauser |
| 3,885,701 A | 5/1975 | Becklin |
| 3,972,459 A | 8/1976 | Cooper |
| 3,978,830 A | 9/1976 | Toth, Jr. |
| 4,298,204 A | 11/1981 | Jinkins |
| 4,564,880 A | 1/1986 | Christ et al. |
| 4,607,772 A | 8/1986 | Hancock |
| 4,828,558 A | 5/1989 | Kelman |
| 4,842,174 A | 6/1989 | Sheppard et al. |
| 4,848,319 A | 7/1989 | Appeldorn |
| 5,002,184 A | 3/1991 | Lloyd |
| 5,052,943 A | 10/1991 | Davis |
| 5,096,317 A | 3/1992 | Phillippe |
| 5,135,189 A | 8/1992 | Ghazizadeh |
| 5,246,133 A | 9/1993 | James |
| 5,272,771 A | 12/1993 | Ansell et al. |
| 5,295,602 A | 3/1994 | Swanson |
| 5,353,934 A | 10/1994 | Yamauchi |
| 5,388,692 A | 2/1995 | Withrow et al. |
| 5,457,745 A | 10/1995 | Wang |
| 5,535,274 A | 7/1996 | Braitberg et al. |
| 5,584,054 A | 12/1996 | Tyneski et al. |
| 5,586,002 A | 12/1996 | Notarianni |
| 5,641,065 A | 6/1997 | Owens et al. |
| 5,646,649 A | 7/1997 | Iwata et al. |
| 5,708,707 A | 1/1998 | Halttunen et al. |
| 5,791,506 A | 8/1998 | Sheffler et al. |
| 5,813,096 A | 9/1998 | Soennichsen |
| 5,822,427 A | 10/1998 | Braitberg et al. |
| 5,842,670 A | 12/1998 | Nigoghosian |
| 5,845,885 A | 12/1998 | Carnevali |
| 5,860,550 A | 1/1999 | Miller et al. |
| 5,888,087 A | 3/1999 | Hanson et al. |
| 5,895,018 A | 4/1999 | Rielo |
| 5,953,795 A | 9/1999 | Bauer |
| 5,969,057 A | 10/1999 | Schoeley et al. |
| 5,990,874 A | 11/1999 | Tsumura et al. |
| 5,992,807 A | 11/1999 | Tarulli |
| 6,009,601 A | 1/2000 | Kaufman |
| 6,010,005 A | 1/2000 | Reames et al. |
| 6,032,910 A | 3/2000 | Richter |
| 6,034,505 A | 3/2000 | Arthur et al. |
| 6,035,800 A | 3/2000 | Clifford |
| 6,043,626 A | 3/2000 | Snyder et al. |
| 6,068,119 A | 5/2000 | Derr et al. |
| 6,149,116 A | 11/2000 | Won |
| 6,191,943 B1 | 2/2001 | Tracy |
| D439,218 S | 3/2001 | Yu |
| 6,229,893 B1 | 5/2001 | Chen |
| 6,273,773 B1 | 8/2001 | Bourke |
| 6,276,552 B1 | 8/2001 | Vervisch |
| 6,295,198 B1 | 9/2001 | Loh et al. |
| 6,317,313 B1 | 11/2001 | Mosgrove et al. |
| 6,341,218 B1 | 1/2002 | Poplawsky et al. |
| 6,356,053 B1 | 3/2002 | Sandoz et al. |
| 6,377,825 B1 | 4/2002 | Kennedy et al. |
| 6,392,882 B1 | 5/2002 | Chen et al. |
| 6,406,758 B1 | 6/2002 | Bottari et al. |
| 6,407,860 B1 | 6/2002 | Funazaki et al. |
| 6,438,229 B1 | 8/2002 | Overy et al. |
| 6,561,476 B2 | 5/2003 | Carnevali |
| 6,565,363 B2 | 5/2003 | Downing |
| 6,572,176 B2 | 6/2003 | Davies et al. |
| 6,585,212 B2 | 7/2003 | Carnevali |
| 6,588,637 B2 | 7/2003 | Gates et al. |
| 6,597,924 B1 | 7/2003 | Smith |
| 6,614,423 B1 | 9/2003 | Wong et al. |
| 6,646,864 B2 | 11/2003 | Richardson |
| 6,648,376 B2 | 11/2003 | Christianson |
| 6,687,516 B2 | 2/2004 | Chen |
| 6,702,604 B1 | 3/2004 | Moscovitch |
| 6,714,802 B1 | 3/2004 | Barvesten |
| 6,754,343 B2 | 6/2004 | Lundstrom et al. |
| 6,762,585 B2 | 7/2004 | Liao |
| 6,776,422 B1 | 8/2004 | Toy |
| 6,785,566 B1 | 8/2004 | Irizarry |
| 6,785,567 B2 | 8/2004 | Kato |
| 6,816,713 B2 | 11/2004 | Chen |
| 6,842,171 B2 | 1/2005 | Richter et al. |
| 6,902,473 B1 * | 6/2005 | Goobeck ............ B60H 1/00592 |
| | | 454/903 |
| 6,953,126 B2 | 10/2005 | Parker et al. |
| 6,984,680 B2 | 1/2006 | Quinn |
| 6,995,976 B2 | 2/2006 | Richardson |
| 7,017,243 B2 | 3/2006 | Carnevali |
| 7,031,148 B1 | 4/2006 | Lin |
| 7,054,042 B2 | 5/2006 | Holmes et al. |
| 7,068,783 B2 | 6/2006 | Peiker |
| 7,158,376 B2 | 1/2007 | Richardson et al. |
| 7,180,735 B2 | 2/2007 | Thomas et al. |
| 7,203,058 B2 | 4/2007 | Hong |
| 7,230,823 B2 | 6/2007 | Richardson et al. |
| 7,236,356 B2 | 6/2007 | Ulla et al. |
| 7,248,901 B2 | 7/2007 | Peiker |
| 7,257,429 B2 | 8/2007 | Kogan |
| 7,283,849 B2 | 10/2007 | Peiker |
| 7,311,526 B2 | 12/2007 | Rohrbach et al. |
| 7,312,984 B2 | 12/2007 | Richardson et al. |
| 7,320,450 B2 | 1/2008 | Carnevali |
| 7,329,128 B1 | 2/2008 | Awad |
| 7,351,066 B2 | 4/2008 | DiFonzo et al. |
| 7,430,674 B2 | 9/2008 | von Mueller et al. |
| 7,464,814 B2 | 12/2008 | Carnevali |
| 7,480,138 B2 | 1/2009 | Kogan et al. |
| 7,481,664 B1 | 1/2009 | Knoll et al. |
| 7,517,222 B2 | 4/2009 | Rohrbach et al. |
| 7,520,389 B2 | 4/2009 | Lalouette |
| 7,551,458 B2 | 6/2009 | Carnevali |
| 7,566,224 B2 | 7/2009 | Wu |
| 7,573,706 B2 | 8/2009 | Carnevali |
| 7,594,576 B2 | 9/2009 | Chen et al. |
| 7,609,512 B2 | 10/2009 | Richardson et al. |
| 7,612,997 B1 | 11/2009 | Diebel et al. |
| 7,625,212 B2 | 12/2009 | Du |
| 7,641,477 B2 | 1/2010 | DiFonzo et al. |
| 7,645,143 B2 | 1/2010 | Rohrbach et al. |
| 7,663,879 B2 | 2/2010 | Richardson et al. |
| 7,688,580 B2 | 3/2010 | Richardson et al. |
| 7,775,801 B2 | 8/2010 | Shiff et al. |
| 7,782,610 B2 | 8/2010 | Diebel et al. |
| 7,812,567 B2 | 10/2010 | Shen |
| 7,841,776 B2 | 11/2010 | DiFonzo et al. |
| 7,850,032 B2 | 12/2010 | Carnevali et al. |
| 7,855,529 B2 | 12/2010 | Liu |
| RE42,060 E | 1/2011 | Carnevali |
| 7,889,489 B2 | 2/2011 | Richardson et al. |
| 7,889,498 B2 | 2/2011 | Diebel et al. |
| 7,894,180 B2 | 2/2011 | Carnevali |
| 7,901,216 B2 | 3/2011 | Rohrbach et al. |
| 7,907,394 B2 | 3/2011 | Richardson et al. |
| 7,911,779 B1 | 3/2011 | Tarnoff |
| 7,946,868 B1 | 5/2011 | Chen |
| 7,946,891 B2 | 5/2011 | Peiker |
| 7,970,440 B2 | 6/2011 | Bury |
| RE42,581 E | 8/2011 | Carnevali |
| 7,997,554 B2 | 8/2011 | Carnevali |
| 8,054,042 B2 | 11/2011 | Griffin, Jr. et al. |
| 8,061,516 B2 | 11/2011 | Carnevali |
| 8,062,078 B2 | 11/2011 | Asai et al. |
| 8,074,951 B2 | 12/2011 | Carnevali |
| 8,080,975 B2 | 12/2011 | Bessa et al. |
| 8,087,939 B2 | 1/2012 | Rohrbach et al. |
| 8,099,138 B2 | 1/2012 | Piekarz |
| 8,167,624 B2 | 5/2012 | Hartlef et al. |
| 8,172,580 B1 | 5/2012 | Chen et al. |
| 8,177,178 B2 | 5/2012 | Carnevaali |
| 8,177,560 B2 | 5/2012 | Rohrbach et al. |
| 8,179,672 B2 | 5/2012 | Carnevali |
| 8,183,825 B2 | 5/2012 | Sa |

(56)                References Cited

U.S. PATENT DOCUMENTS

| | | | |
|---|---|---|---|
| 8,224,408 | B2 | 7/2012 | Tomasini et al. |
| 8,295,043 | B2 | 10/2012 | Tai et al. |
| RE43,806 | E | 11/2012 | Carnevali |
| 8,367,235 | B2 | 2/2013 | Huang |
| 8,390,255 | B1 | 3/2013 | Fathollahi |
| 8,405,974 | B2 | 3/2013 | Sayavong |
| 8,414,312 | B2 | 4/2013 | Hung et al. |
| 8,430,240 | B2 | 4/2013 | Kim |
| 8,435,042 | B2 | 5/2013 | Rohrbach et al. |
| 8,453,835 | B2 | 6/2013 | So |
| 8,454,178 | B2 | 6/2013 | Carnevali |
| 8,457,701 | B2 | 6/2013 | Diebel |
| 8,483,758 | B2 | 7/2013 | Huang |
| 8,497,753 | B2 | 7/2013 | DiFonzo et al. |
| 8,505,861 | B2 | 8/2013 | Carnevali |
| 8,531,833 | B2 | 9/2013 | Diebel et al. |
| 8,553,408 | B2 | 10/2013 | Supran et al. |
| 8,560,014 | B1 | 10/2013 | Hu et al. |
| 8,634,887 | B2 | 1/2014 | Hu et al. |
| 8,639,288 | B1 | 1/2014 | Friedman |
| 8,646,698 | B2 | 2/2014 | Chen et al. |
| 8,675,359 | B2 | 3/2014 | Chen |
| 8,690,582 | B2 | 4/2014 | Rohrbach et al. |
| 8,702,316 | B2 | 4/2014 | DiFonzo et al. |
| 8,729,854 | B2 | 5/2014 | Tsai et al. |
| 8,760,311 | B2 | 6/2014 | Heaton |
| 8,763,802 | B2 | 7/2014 | Ellis-Brown |
| 8,801,441 | B2 | 8/2014 | Zhang et al. |
| 8,825,123 | B1 | 9/2014 | Gudino |
| 8,833,716 | B2 | 9/2014 | Funk et al. |
| 8,844,817 | B2 | 9/2014 | Glanzer et al. |
| 8,873,233 | B2 | 10/2014 | Reber et al. |
| D718,293 | S | 11/2014 | Namminga |
| 8,891,800 | B1 | 11/2014 | Shaffer |
| 8,894,420 | B2 | 11/2014 | Schichl et al. |
| 8,907,783 | B2 | 12/2014 | Fish et al. |
| 8,911,246 | B2 | 12/2014 | Carnevali |
| 8,917,506 | B2 | 12/2014 | Diebel et al. |
| 8,929,065 | B2 | 1/2015 | Williams |
| 8,950,717 | B2 | 2/2015 | Chuang |
| 8,970,332 | B2 | 3/2015 | DiFonzo et al. |
| 9,007,758 | B2 | 4/2015 | Wilson et al. |
| 9,011,184 | B2 | 4/2015 | Chen et al. |
| 9,019,698 | B2 | 4/2015 | Thiers |
| 9,026,187 | B2 | 5/2015 | Huang |
| 9,036,343 | B2 | 5/2015 | Carnevali |
| 9,071,060 | B2 | 6/2015 | Fathollahi |
| 9,072,172 | B2 | 6/2015 | Hsu |
| 9,077,794 | B2 | 7/2015 | Narendra et al. |
| 9,089,059 | B1 | 7/2015 | Haskin et al. |
| 9,112,304 | B2 | 8/2015 | Rohrbach et al. |
| 9,123,935 | B2 | 9/2015 | Huang |
| 9,147,966 | B2 | 9/2015 | An |
| 9,172,781 | B1 | 10/2015 | Goldstein |
| 9,195,279 | B2 | 11/2015 | Carnevali et al. |
| 9,201,593 | B2 | 12/2015 | Collopy et al. |
| 9,229,494 | B2 | 1/2016 | Rayner |
| 9,288,295 | B2 | 3/2016 | Ivanovski et al. |
| 9,298,661 | B2 | 3/2016 | Hamel et al. |
| 9,300,078 | B2 | 3/2016 | Liu et al. |
| 9,300,081 | B2 | 3/2016 | Rudisill et al. |
| 9,331,444 | B2 | 5/2016 | Carnevali |
| 9,356,267 | B1 | 5/2016 | To et al. |
| 9,495,375 | B2 | 11/2016 | Huang et al. |
| 9,529,387 | B2 | 12/2016 | Carnevali |
| 9,535,457 | B1 | 1/2017 | Vier |
| 9,567,776 | B2 | 2/2017 | Moock et al. |
| 9,591,113 | B2 | 3/2017 | Filser et al. |
| 9,602,639 | B2 | 3/2017 | Carnevali |
| 9,632,535 | B2 | 4/2017 | Carnevali et al. |
| 9,641,207 | B1 * | 5/2017 | Bevers ................. H04B 1/3877 |
| 9,647,474 | B2 | 5/2017 | Fathollahi et al. |
| 9,706,026 | B2 | 7/2017 | Carnevali |
| 9,742,885 | B2 | 8/2017 | Rostami |
| 9,748,535 | B2 | 8/2017 | Huang et al. |
| 9,760,116 | B2 | 9/2017 | Wylie |
| 9,762,013 | B2 | 9/2017 | George et al. |
| 9,774,713 | B2 | 9/2017 | Guerdrum et al. |
| 9,776,577 | B2 | 10/2017 | Carnevali |
| 9,807,211 | B2 | 10/2017 | Guerdrum et al. |
| 9,809,175 | B2 | 11/2017 | Jonik et al. |
| 9,817,441 | B1 | 11/2017 | Kuo |
| 9,831,904 | B1 | 11/2017 | Carnevali |
| 9,898,041 | B2 | 2/2018 | Blowers et al. |
| 9,924,005 | B1 | 3/2018 | McElderry |
| 9,939,850 | B2 | 4/2018 | Hoellwarth et al. |
| 10,033,204 | B2 | 7/2018 | Huang et al. |
| 10,050,658 | B2 | 8/2018 | Carnevali |
| 10,054,984 | B2 | 8/2018 | Carnevali et al. |
| 10,148,104 | B2 | 12/2018 | Sa |
| 10,170,738 | B2 | 1/2019 | Huang et al. |
| 10,172,246 | B2 | 1/2019 | Apter |
| 10,279,645 | B1 * | 5/2019 | Nazarian ................. B60R 11/02 |
| 10,330,251 | B2 | 6/2019 | Carnevali |
| 10,389,399 | B2 | 8/2019 | Carnevali |
| 10,401,905 | B2 | 9/2019 | Carnevali |
| 10,416,715 | B1 | 9/2019 | Wade et al. |
| 10,454,515 | B2 | 10/2019 | Carnevali |
| 10,485,312 | B2 | 11/2019 | Rodriguez |
| 10,516,431 | B2 | 12/2019 | DiLella |
| 10,548,380 | B2 | 2/2020 | Rayner et al. |
| 10,559,788 | B2 | 2/2020 | Huang et al. |
| 10,630,334 | B2 | 4/2020 | Carnevali |
| 10,656,687 | B2 | 5/2020 | Tashiro et al. |
| 10,666,309 | B2 | 5/2020 | Carnevali |
| 10,707,632 | B1 | 7/2020 | Yamamoto et al. |
| 10,714,953 | B1 | 7/2020 | Solana et al. |
| 10,778,275 | B2 | 9/2020 | Carnevali |
| 10,788,857 | B2 | 9/2020 | Huang et al. |
| 10,812,643 | B1 | 10/2020 | Carnevali et al. |
| D903,685 | S | 12/2020 | Wright et al. |
| 10,928,856 | B1 | 2/2021 | Hamlin et al. |
| D915,373 | S | 4/2021 | Zhou |
| 10,976,777 | B2 | 4/2021 | Pischel |
| 11,029,731 | B1 | 6/2021 | Carnevali |
| D924,863 | S | 7/2021 | Wright et al. |
| 11,076,032 | B1 | 7/2021 | Carnevali |
| 11,165,458 | B2 | 11/2021 | Carnevali |
| 11,277,506 | B2 | 3/2022 | Carnevali |
| 11,289,864 | B2 | 3/2022 | Carnevali et al. |
| 11,489,350 | B2 | 11/2022 | Carnevali |
| 11,522,379 | B2 | 12/2022 | Lee et al. |
| 11,597,334 | B2 | 3/2023 | Telesco et al. |
| 11,619,971 | B1 | 4/2023 | Passe et al. |
| 11,622,032 | B2 | 4/2023 | Wright et al. |
| 11,652,326 | B2 | 5/2023 | Carnevali |
| 12,132,511 | B2 | 10/2024 | Carnevali |
| D1,052,884 | S | 12/2024 | Hong |
| 2002/0009194 | A1 | 1/2002 | Wong et al. |
| 2002/0032041 | A1 | 3/2002 | Hirai et al. |
| 2002/0136557 | A1 | 9/2002 | Shimamura |
| 2002/0191782 | A1 | 12/2002 | Beger et al. |
| 2002/0193136 | A1 | 12/2002 | Halkosaari et al. |
| 2003/0068986 | A1 | 4/2003 | Oh |
| 2003/0116631 | A1 | 6/2003 | Salvato et al. |
| 2003/0218445 | A1 | 11/2003 | Behar |
| 2004/0108348 | A1 | 6/2004 | Barnes |
| 2004/0209489 | A1 | 10/2004 | Clapper |
| 2005/0189354 | A1 | 9/2005 | Heather et al. |
| 2006/0058073 | A1 | 3/2006 | Kim |
| 2006/0175766 | A1 | 8/2006 | Carnevali |
| 2007/0127204 | A1 | 6/2007 | Muenzer et al. |
| 2007/0261978 | A1 | 11/2007 | Sanderson |
| 2008/0053770 | A1 | 3/2008 | Tynyk |
| 2008/0104301 | A1 | 5/2008 | Assouad et al. |
| 2008/0149796 | A1 | 6/2008 | Moscovitch |
| 2008/0273734 | A1 | 11/2008 | Solland |
| 2008/0320190 | A1 | 12/2008 | Lydon et al. |
| 2009/0021903 | A1 | 1/2009 | Chen et al. |
| 2009/0140113 | A1 | 6/2009 | Carnevali |
| 2009/0160400 | A1 | 6/2009 | Woud |
| 2009/0314400 | A1 | 12/2009 | Liu |
| 2010/0013431 | A1 | 1/2010 | Liu |
| 2010/0078343 | A1 | 4/2010 | Hoellwarth et al. |

(56)                    References Cited

U.S. PATENT DOCUMENTS

| | | |
|---|---|---|
| 2011/0122565 A1 | 5/2011 | Liu |
| 2011/0134601 A1 | 6/2011 | Sa |
| 2011/0159324 A1 | 6/2011 | Huang et al. |
| 2011/0247398 A1* | 10/2011 | Breed .................... G01M 3/26 |
| | | 73/40.5 R |
| 2011/0287726 A1 | 11/2011 | Huang |
| 2011/0299238 A1 | 12/2011 | Radin et al. |
| 2012/0018325 A1 | 1/2012 | Kim |
| 2012/0043235 A1 | 2/2012 | Klement |
| 2012/0088558 A1 | 4/2012 | Song |
| 2012/0118773 A1 | 5/2012 | Rayner |
| 2012/0161706 A1 | 6/2012 | Zhou |
| 2012/0211382 A1 | 8/2012 | Rayner |
| 2012/0250270 A1 | 10/2012 | Liu |
| 2012/0261306 A1 | 10/2012 | Richardson et al. |
| 2012/0298536 A1 | 11/2012 | Rauta et al. |
| 2012/0303520 A1 | 11/2012 | Huang |
| 2013/0002193 A1 | 1/2013 | Aldana et al. |
| 2013/0023313 A1 | 1/2013 | Kim |
| 2013/0088188 A1 | 4/2013 | Romanenko |
| 2013/0092576 A1 | 4/2013 | Rayner |
| 2013/0106353 A1 | 5/2013 | Foster |
| 2013/0193006 A1 | 8/2013 | Bergreen et al. |
| 2013/0220841 A1 | 8/2013 | Yang |
| 2013/0222991 A1 | 8/2013 | McWilliams |
| 2013/0258573 A1 | 10/2013 | Muday et al. |
| 2013/0273752 A1 | 10/2013 | Rudisill et al. |
| 2013/0273824 A1* | 10/2013 | Lang .................. B60H 1/00271 |
| | | 454/141 |
| 2013/0273983 A1 | 10/2013 | Hsu |
| 2013/0300267 A1 | 11/2013 | Richardson et al. |
| 2013/0322568 A1 | 12/2013 | Pais et al. |
| 2013/0331156 A1 | 12/2013 | Lui |
| 2013/0334071 A1 | 12/2013 | Carnevali |
| 2014/0035511 A1 | 2/2014 | Ferber et al. |
| 2014/0036420 A1 | 2/2014 | Chen |
| 2014/0042285 A1 | 2/2014 | Carnevali |
| 2014/0055928 A1 | 2/2014 | Lee |
| 2014/0059264 A1 | 2/2014 | Sudak |
| 2014/0065948 A1 | 3/2014 | Huang |
| 2014/0066144 A1 | 3/2014 | Hong |
| 2014/0070774 A1 | 3/2014 | Terlizzi et al. |
| 2014/0099526 A1 | 4/2014 | Powell et al. |
| 2014/0168885 A1 | 6/2014 | Williams |
| 2014/0307376 A1 | 10/2014 | Lee |
| 2014/0347000 A1 | 11/2014 | Hamann et al. |
| 2014/0363988 A1 | 12/2014 | An |
| 2015/0011099 A1 | 1/2015 | Kim et al. |
| 2015/0055289 A1 | 2/2015 | Chang et al. |
| 2015/0098184 A1 | 4/2015 | Tsai et al. |
| 2015/0146401 A1 | 5/2015 | Su et al. |
| 2015/0189780 A1 | 7/2015 | Su et al. |
| 2015/0270861 A1 | 9/2015 | Lin et al. |
| 2016/0065702 A1 | 3/2016 | Carnevali |
| 2016/0231779 A1 | 8/2016 | Kaneko et al. |
| 2016/0309010 A1 | 10/2016 | Carnevali |
| 2017/0054312 A1 | 2/2017 | Kuchynka et al. |
| 2017/0080877 A1* | 3/2017 | Boas .................. B60R 11/0241 |
| 2017/0227987 A1 | 8/2017 | Carnevali et al. |
| 2018/0210520 A1* | 7/2018 | Lavy .................. G05D 23/1917 |
| 2018/0279809 A1 | 10/2018 | Regan et al. |
| 2018/0314296 A1 | 11/2018 | Evns, V et al. |
| 2019/0267825 A1 | 8/2019 | Chien |
| 2020/0195763 A1 | 6/2020 | Ellis |
| 2020/0197563 A1 | 6/2020 | Shen et al. |
| 2020/0326955 A1 | 10/2020 | Adiletta et al. |
| 2020/0328774 A1* | 10/2020 | Darolfi .................... H04M 1/06 |
| 2020/0330037 A1 | 10/2020 | Al-Ali et al. |
| 2020/0371555 A1 | 11/2020 | Huang et al. |
| 2021/0048848 A1 | 2/2021 | Pischel |
| 2021/0194256 A1 | 6/2021 | Carnevali |
| 2021/0391678 A1 | 12/2021 | Carnevali |
| 2021/0392773 A1 | 12/2021 | Carnevali |
| 2022/0026951 A1 | 1/2022 | Wood, III et al. |
| 2022/0066505 A1 | 3/2022 | Lu et al. |
| 2022/0074523 A1* | 3/2022 | Whittemore ............ E04G 21/30 |
| 2022/0253097 A1 | 8/2022 | Carnevali et al. |
| 2022/0352682 A1 | 11/2022 | Carnevali |
| 2023/0039167 A1 | 2/2023 | Kamepalli et al. |
| 2023/0045485 A1 | 2/2023 | Carnevali et al. |
| 2023/0341897 A1 | 10/2023 | Carnevali et al. |
| 2024/0399976 A1 | 12/2024 | Carnevali et al. |
| 2024/0403251 A1 | 12/2024 | Anderson |
| 2025/0224768 A1 | 7/2025 | Carnevali |
| 2025/0226846 A1 | 7/2025 | Carnevali |

FOREIGN PATENT DOCUMENTS

| | | |
|---|---|---|
| CN | 202268924 | 6/2012 |
| CN | 202565335 | 11/2012 |
| CN | 204334055 | 5/2015 |
| CN | 204334674 | 5/2015 |
| CN | 204408423 | 6/2015 |
| JP | 2004-349969 | 12/2004 |
| JP | 2014-75327 | 4/2014 |
| KR | 20-0265673 | 2/2002 |
| KR | 10-1078214 | 11/2011 |
| KR | 101609754 B1 | 4/2016 |
| TW | 2003TW531119 | 5/2003 |
| TW | M422808 | 2/2012 |
| WO | 2012/052751 | 4/2012 |
| WO | 2013/081222 | 6/2013 |
| WO | WO 2014/010781 A1 | 1/2014 |
| WO | 2014/054426 | 4/2014 |
| WO | 2015/022675 | 2/2015 |

OTHER PUBLICATIONS

U.S. Appl. No. 18/612,977, filed Mar. 21, 2024.
U.S. Appl. No. 18/218,381, filed Jul. 5, 2023.
U.S. Appl. No. 18/233,218, filed Aug. 11, 2023.
U.S. Appl. No. 18/614,482, filed Mar. 22, 2024.
U.S. Appl. No. 18/638,430, filed Apr. 17, 2024.
U.S. Appl. No. 18/404,795, filed Jan. 4, 2024.
Otterbox Product directory, 20 pages of product description of Otter Box waterproof boxes retrieved from web site at: www.otterbox. com Dated Sep. 2, 2005. Otter Products, LLC, Bldg. 1 Old-Town Square, Suite 303, Fort Collins, CO 80524 Phone: 1-888-695-8820, 970-493-8446; Facsimile: 1-888-695-8827, 970-493-1755.
Officeonthego.com, 3 pages of product description of Magnifico® Plus screen magnifier product information retrieved from web site at: www.officeonthego.com.
2 pages of product information for Armor 1600 and Armor 1601 waterproof, dustproof and airtight protective cases.
2 pages Otterox 4600 Tablet PC Case protective cases product information retrieved from web site at: www.otterbox.com.
Jason Poel Smith: "How to Transplant RFID Chips", Sep. 3, 2013 (Sep. 3, 2013), XP55492991, Retrieved from the Internet: URL: http://www.instructables.com/id/How-to-Transplant-RFID-Chips/ [retrieved on Jul. 17, 2018].
Battery Charging Specification (Including errata and ECNs through Mar. 15, 2012); Revision 1.2, Mar. 15, 2012. 72 pages.
MC40 Integrator Guide, Motorola Solutions, Inc., Oct. 4, 2013.
Various documents for iPort LaunchPort Product, alleged to have been available as early as 2013.
Juice Pack System Air Manual—Juice Pack System Air alleged to have been available as early as Feb. 6, 2013.
Juice Pack System Press Releases dated Jun. 14, 2011; Jun. 19, 2012; and Feb. 6, 2013.
Juice Pack System Dock Manual—Juice Pack System Dock alleged to have been available as early as Feb. 6, 2013.
Juice Pack System images—Juice Pack System alleged to have been available as early as Feb. 6, 2013.
Juice Pack System Helium Manual—Juice Pack System Helium alleged to have been available as early as Feb. 6, 2013.
Juice Pack System Add-Ons—Juice Pack System alleged to have been available as early as Feb. 6, 2013.
Juice Pack System Plus iPhone 6 Manual—Juice Pack System Plus alleged to have been available as early as Feb. 6, 2013.

(56)          References Cited

OTHER PUBLICATIONS

Juice Pack System Dock Page IA—Juice Pack System Dock alleged to have been available as early as Feb. 6, 2013.
Wildcharge System reviews—Wildcharge System alleged to have been available as early as Mar. 23, 2008.
Wildcharge System articles dated Mar. 23, 2008; Jun. 23, 2009; and Sep. 2009.
Wildcharge System webpages—Wildcharge System alleged to have been available as early as Mar. 23, 2008 and these webpages alllegedly are from 2009 and 2010.
Wildcharge System Press Release from Nov. 13, 2007.
Wildcharge System WildCharge Wire Free Power alleged to have been available as early as Mar. 23, 2008.
Wildcharge System WildCharge Skin for iPhone alleged to have been available as early as Mar. 23, 2008.
Wildcharge System images—Wildcharge System alleged to have been available as early as Mar. 23, 2008.

* cited by examiner

Fig. 3A          Fig. 3B

DOCK WITH AIR FLOW ARRANGEMENT FOR HEATING/COOLING AN ELECTRONIC DEVICE AND METHODS OF MAKING AND USING

FIELD

The present invention is directed to a dock for an electronic device with an air flow arrangement for heating/cooling the electronic device. The present invention is also directed to a dock for an electronic device with an air flow arrangement coupleable to an air flow source, such as a vehicle ventilation system.

BACKGROUND

Electronic devices, such as tablets, mobile phones, personal data assistants, or the like, are sensitive to temperature. When the ambient or device temperature is too hot or cold, an electronic device may shut down, operate slowly, or fail to perform. The ideal operating temperature range of electronic devices often fall outside of the temperature range in environments in which the electronic devices are intended to be used. For example, such electronic devices may be used in ambient or device temperatures that are at or below 0° C. (32° F.) or at or above 37° C. (approximately 100° F.), for example, in a vehicle sitting in the sun. These temperatures are typically outside the recommended operating temperature range of most electronic devices. An electronic device may operate at such temperatures for extended periods of time.

BRIEF SUMMARY

One embodiment is a dock for an electronic device that includes a base configured to fit over at least a portion of a back surface of the electronic device; a tray extending from the base for receiving one side of the electronic device, wherein at least one of the base or tray includes an opening through the base or tray; and an air flow arrangement including a hose coupled, or coupleable, to the base or tray for air flow from the hose to pass through the opening in the base or tray and a vent adapter coupled, or coupleable, to the hose and configured for coupling to a vent of an air flow source.

In at least some embodiments, the air flow arrangement further includes a hose fitting coupling the hose to the vent adapter. In at least some embodiments, the air flow arrangement further includes a plurality of magnets disposed in the hose fitting or vent adapter or both for magnetically coupling the hose fitting to the vent adapter. In at least some embodiments, the air flow arrangement further includes a plurality of coupling elements made of a magnetic material and disposed in the hose fitting or vent adapter or both for magnetically coupling the hose fitting to the vent adapter.

In at least some embodiments, the vent adapter includes a shape complementary to vents of a specified vehicle or set of vehicles. In at least some embodiments, the air flow arrangement further includes a tie or strap for coupling the vent adapter to the vent of the air flow source. In at least some embodiments, the air flow arrangement further includes a dock connector for coupling the hose to the base or tray of the dock. In at least some embodiments, the opening is in the base. In at least some embodiments, the opening is in the tray.

Another embodiment is a system that includes any of the docks described above and the electronic device. In at least some embodiments, the system further includes a vehicle including a ventilation system configured to be the air flow source.

A further embodiment is a method for cooling or heating an electronic device disposed in a dock. The method includes providing a dock and an air flow arrangement coupled to the dock, wherein the dock includes a base configured to fit over at least a portion of a back surface of the electronic device and a tray extending from the base for receiving one side of the electronic device, wherein at least one of the base or tray includes an opening through the base or tray, wherein the air flow arrangement includes a hose coupled to the base or tray for air flow from the hose to pass through the opening in the base or tray g and a vent adapter coupled to the hose; coupling the vent adapter to a vent of an air flow source; and operating the air flow source to direct cool air or warm air through the hose to the dock to, respectively, cool or heat the electronic device.

In at least some embodiments, the air flow source is a ventilation system of a vehicle. In at least some embodiments, the providing includes coupling the air flow arrangement to the dock. In at least some embodiments, the coupling includes attaching the vent adapter to the vent using at least one tie or strap. In at least some embodiments, the method further includes decoupling the hose from the vent adapter.

In at least some embodiments, the air flow arrangement further includes a hose fitting coupled to the hose and the method further includes coupling the hose to the vent adapter using the hose fitting. In at least some embodiments, the air flow arrangement further includes a plurality of magnets disposed in the hose fitting or vent adapter or both, wherein coupling the hose to the vent adapter using the hose fitting includes magnetically coupling the hose fitting to the vent adapter using the magnets. In at least some embodiments, the air flow arrangement further includes a plurality of coupling elements made of a magnetic material and disposed in the hose fitting or vent adapter or both, wherein the magnetically coupling includes magnetically coupling the hose fitting to the vent adapter using the magnets and the coupling elements.

Yet another embodiment is an air flow arrangement that includes a hose; a dock connecter coupled, or coupleable, to the hose and configured for coupling to a dock for an electronic device; a hose fitting coupled to the hose; a vent adapter configured for coupling to a vent of an air flow source; and a plurality of magnets disposed in the hose fitting or vent adapter or both and arranged for removably coupling the vent adapter to the hose fitting.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein:

FIG. 3A is a schematic perspective back view of a vent adapter of an air flow arrangement attached to a vent cap of an air flow source, according to the invention;

FIG. 3B is a schematic perspective front view of the vent adapter and vent cap of FIG. 3A, according to the invention;

DETAILED DESCRIPTION

The present invention is directed to a dock for an electronic device with an air flow arrangement for heating/cooling the electronic device. The present invention is also directed to a dock for an electronic device with an air flow arrangement coupleable to an air flow source, such as a vehicle ventilation system.

To heat or cool an electronic device, a dock can include an air flow arrangement. As illustrated in FIGS. 1A to 1D, one embodiment of a dock 100 includes a base 102 and a tray 104 extending from a base 102. The tray 104 receives one side of an electronic device 150, such as a mobile device (for example, a mobile phone, tablet, personal data assistant, or the like) or a laptop. Examples of docks that can be modified to include an air flow arrangement can be found in, for example, U.S. Pat. Nos. 7,573,706; 7,894,180; 8,179, 672; 9,036,343; 9,831,904; 11,029,731; 11,076,032; 11,277, 506; 11,489,350; and 11,652,326 and U.S. Patent Application Publications Nos. 2022/0253097 and 2023/0045485, all of which are incorporated by reference in their entireties.

Figure 4:
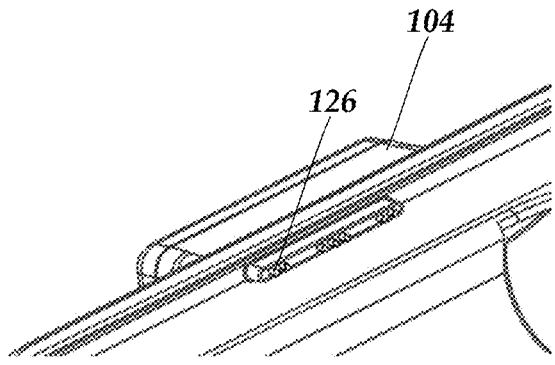
FIG. 4 is a schematic perspective view of a portion of the dock of FIG. 2, according to the invention.

In at least some embodiments, an electronic device 150, such as a mobile device, may be disposed within a cover 152. In at least some embodiments, the dock 102 includes one or more contacts 126 (FIG. 4) disposed in the tray 104 and configured to couple to contacts on the cover 152 or electronic device 150. Examples of covers 152 for an electronic device 150 are described in U.S. Pat. Nos. 9,195, 279; 9,331,444; 9,529,387; 9,602,639; 9,632,535; 9,706, 026; 10,389,399; 10,050,658; 10,054,984; 10,454,515; 10,630,334; 10,666,309; 10,778,275 10,812,643; 11,029, 731; 11,076,032; 11,165,458; 11, 277,506; and 11,289,864 and U.S. Patent Applications Publication Nos. 2021/ 0391678 and 2021/0392773, all of which are incorporated herein by reference in their entireties.

In at least some embodiments, the dock 100 also includes at least one attachment arm 106, 106' extending from the base 102 for attaching the dock to the electronic device 150. Each attachment arm 106, 106' has a back engagement portion 108, a front engagement portion 110, and a width portion 112 extending between the back and front engagement portions. In at least some embodiments, the back and front engagement portions 108, 110 are arranged to fit snugly on the electronic device 150 disposed therein to retain the electronic device in the dock 100. In at least some embodiments, the front engagement portion 110 of an attachment arm 106' includes a roller 114 which can roll on an axle held by two legs to facilitate retention of the electronic device 150 within the dock 100.

In at least some embodiments, the dock 100 can have attached, or attachable, to one or more accessories, such as a mount 170. The mount 170 can be attached to a mounting arrangement 122 on the dock 100 which includes multiple attachment apertures 124 for receiving a fastener to attach the mount to the mounting arrangement. Non-limiting examples of mounts and mounting devices can be found at, for example, U.S. Pat. Nos. 5,845,885; 6,561,476; 7,320,50; 7,997,554; 8,454,178; 8,505,861; 9,831,904; RE42,060; RE42,581; and RE43,806, all of which are incorporated herein by reference in their entireties.

As indicated above, electronic devices, such as tablets, phones, or personal data assistants, are sensitive to temperature. As described herein, a dock can include an air flow arrangement for directing heating or cooling air from an external source, such as a vehicle's ventilation system (e.g., a heating or cooling system) to heat or cool the electronic device. FIGS. 1A to 1D illustrate one embodiment of such an air flow arrangement 138 attached (or attachable) to the dock 100. The air flow arrangement 138 includes a hose 140, a dock connector 142 for attaching the hose to the dock 100 over an opening 156 in the dock, a hose fitting 144, and a vent adapter 146 that is coupled to the hose by the hose fitting and is configured for coupling to a vent of an air flow source. The components of the air flow arrangement 138 can be made of any suitable materials including, but not limited to, plastic, metal, or the like or any combination thereof.

In at least some embodiments, the hose 140 and one or both of the dock connector 142 and the hose fitting 144 can be a single, unitary, non-divisible piece. In at least some embodiments, the hose fitting 144 and vent adapter 146 can be a single, unitary, non-divisible piece. The term "non-divisible" means that two or more components are not intended to be separated under normal use or circumstances.

The dock 100 includes a hose connection port 154 disposed around an opening 156 for passage of heating or cooling air from the air flow arrangement 138 through the base 102 or tray 104 to the electronic device 150 disposed in the dock 100. In at least some embodiments, a grill 158 (or filter) can be placed over the opening 156. In at least some embodiments, the dock connector 142 and hose connection port 154 can be permanently attached or removably attached to each other.

In the embodiment of the dock 100 illustrated in FIGS. 1A to 1D, the hose connector port 154 is part of the base 102 and the opening extends through the base. In another embodiment of a dock 200, illustrated in FIG. 2, the hose connection port 154 is part of the tray 104 and the opening 156 extends through the tray. When contacts 126 (FIG. 4) of the dock 200 and electronic device 150 are positioned on or near the tray, the air flow arrangement 138 and dock 200 can be used to cool or heat these contacts.

In at least some embodiments, the air flow arrangement 138 is arranged for coupling to a vehicle's heating/cooling vents or other ventilation system. In at least some embodiments, the vent adapter 146 has a shape that is complementary to the ventilation vents of a particular vehicle or set of vehicles. In at least some embodiments, a user can control the temperature of the electronic device 150 using the temperature controls of the vehicle.

Figure 1A:
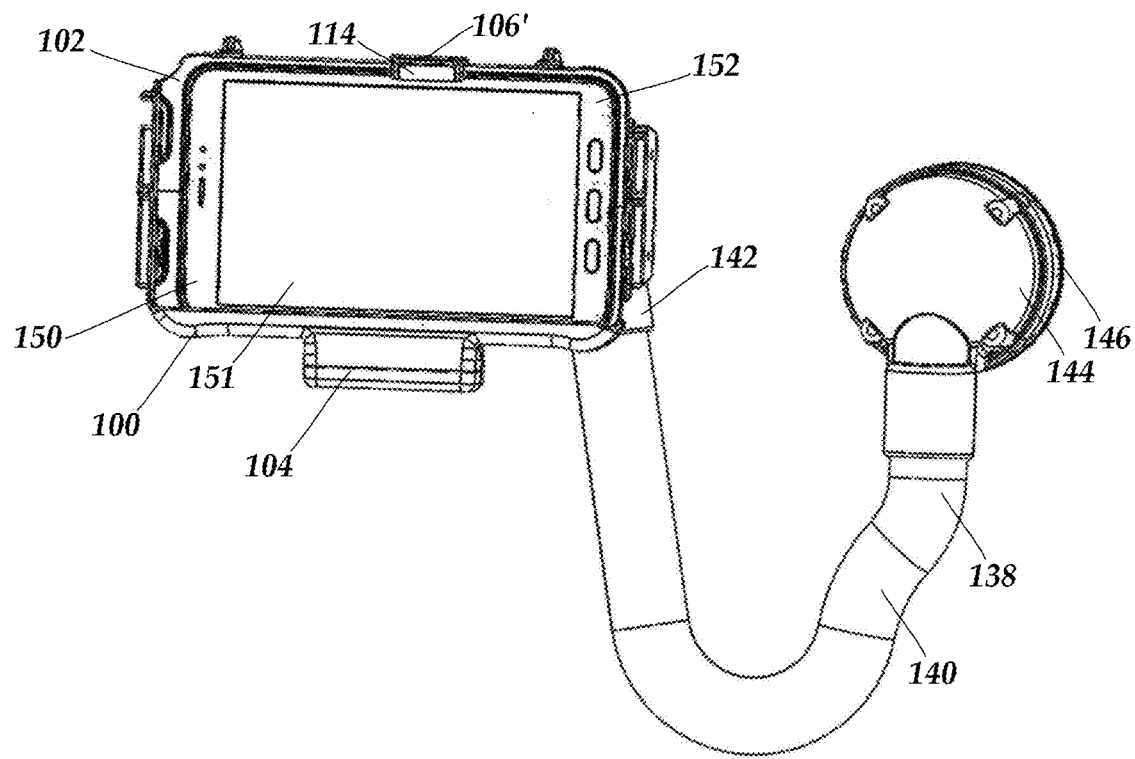
FIG. 1A is a schematic perspective front view of another embodiment of a dock with an electronic device disposed in the dock and an air flow arrangement attached to a base of the dock, according to the invention.
Figure 1B:
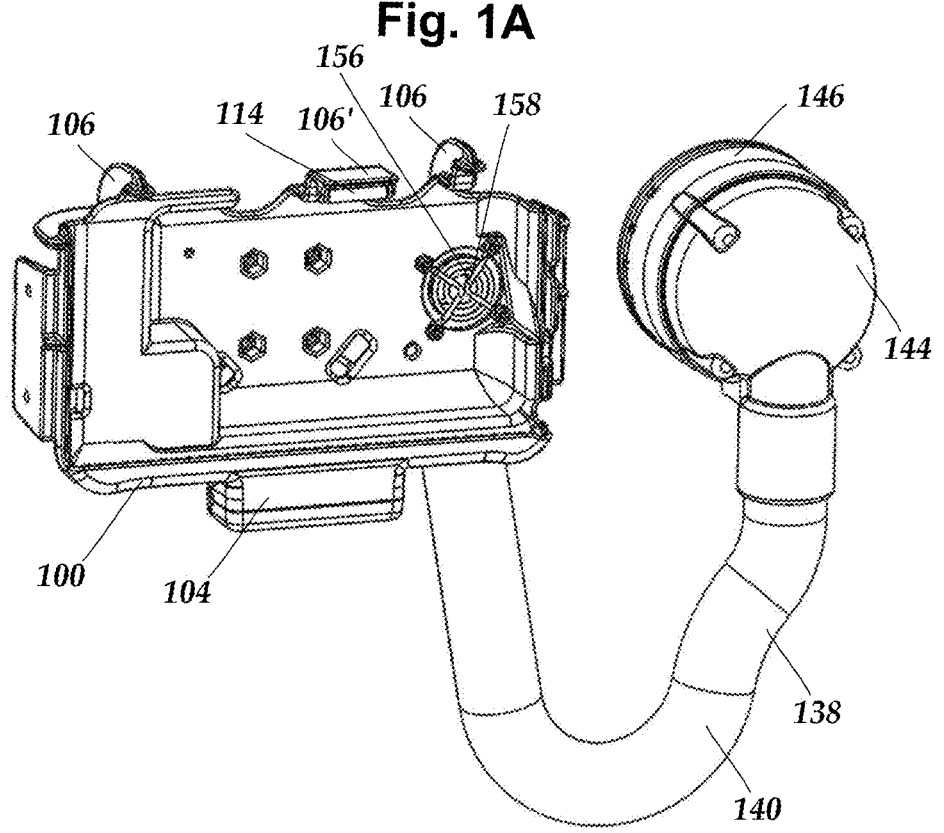
FIG. 1B is a schematic perspective front view of the dock with air flow arrangement of FIG. 1A with the electronic device removed, according to the invention.
Figures 1C, 1D:
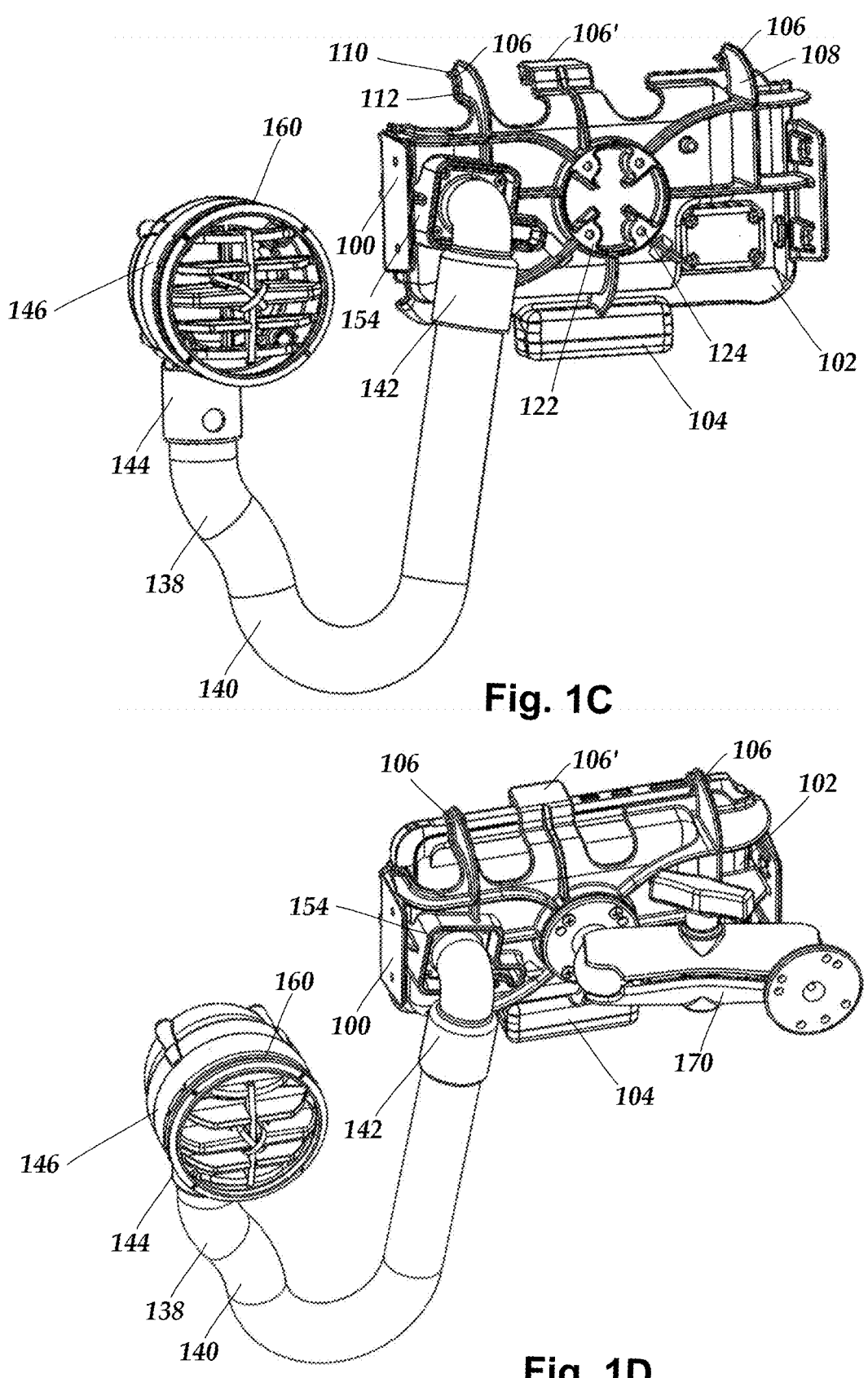
FIG. 1C is a schematic perspective back view of the dock with air flow arrangement of FIG. 1A with the electronic device removed, according to the invention.
FIG. 1D is a schematic perspective back view of the dock with air flow arrangement of FIG. 1A with a mount attached to the dock, according to the invention.
Figures 2, 3D:
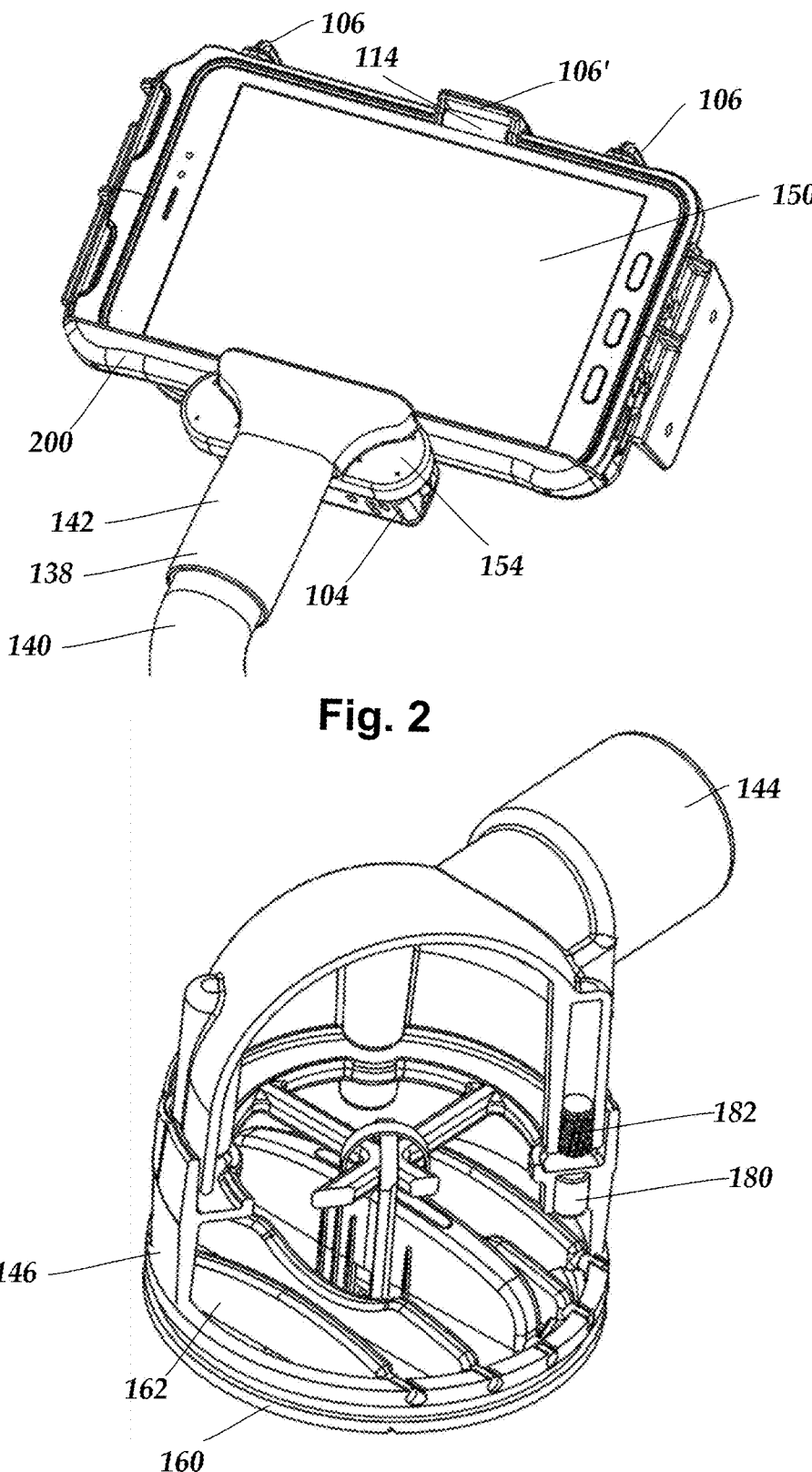
FIG. 2 is a schematic perspective front view of another embodiment of a dock with an electronic device disposed in the dock and an air flow arrangement attached to a tray of the dock, according to the invention.
FIG. 3D is a schematic perspective side view, with partial cut-away section, of the vent adapter and vent cap of FIG. 3A including a hose fitting of the air flow arrangement, according to the invention.
Figure 3C:
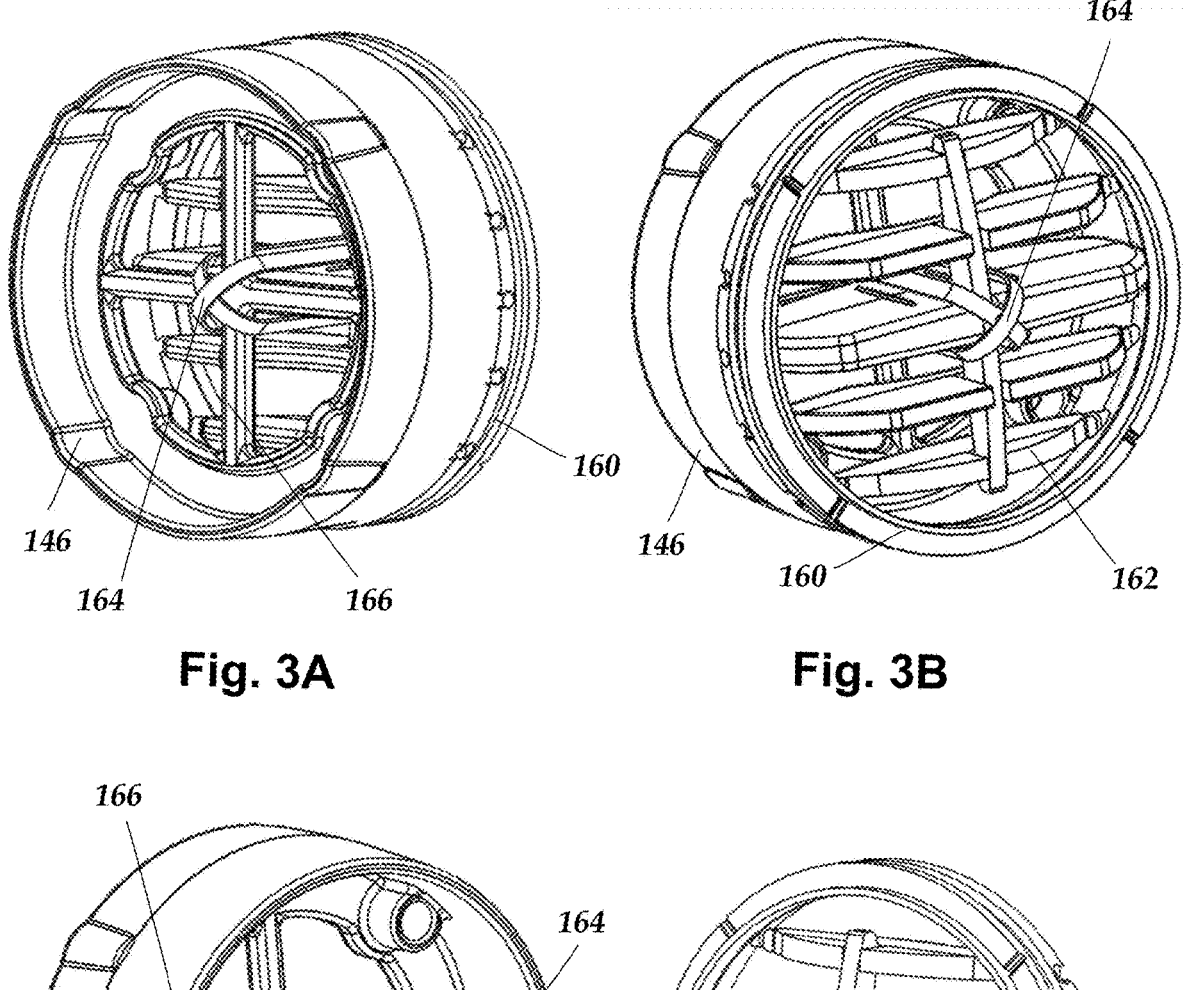
FIG. 3C is a schematic perspective view of the vent adapter and vent cap of FIG. 3A separated from each other, according to the invention.

FIGS. 3A to 3C illustrate coupling or attachment of the vent adapter 146 to a vent cap 160 of a ventilation system. In at least some embodiments, the vent cap 160 includes fins 162 which may or may not be adjustable. Preferably, the vent adapter 146 is removably attached to the vent cap 160. In at least some embodiments, the air flow arrangement 138 includes one or more ties or straps 164 (or any other suitable fastener) for attaching the vent adapter 146 to the vent cap 160. In at least some embodiments, the vent adapter 146 includes one or more crossbars 166 (or any other suitable structure) for attaching the tie(s) or strap(s) 164. In at least some embodiments, the tie or strap 164 is a nylon tie.

In other embodiments, the hose fitting 144 and vent adapter 146 are two separate pieces that are removably coupled or attached to each other. The hose fitting 144 and vent adapter 146 can be removably coupled or attached using any suitable attachment mechanism including, but not limited to, snap-fit arrangements, buckles or other fasteners, rotating connectors (for example, screw type or pin/track type rotating connectors), or the like or any combination thereof.

FIG. 3D illustrated another attachment mechanism in which magnets 180 are disposed in at least one of the hose fitting 144 or the vent adapter 146. In at least some embodiments, magnets 180 can be provided in both the hose fitting 144 and the vent adapter 146 and arranged to couple to each other. In other embodiments, coupling elements, such as plugs 182, made of a magnetic material, such as iron or steel, can be disposed in at least one of the hose fitting 144 or the vent adapter 146 and arranged to couple to opposing magnets in the hose fitting or the vent adapter.

In some embodiments, the magnets 180 are disposed in either the hose fitting 144 or the vent adapter 146 and the plugs 182 are disposed in the other one of the hose fitting or the vent adapter. In the embodiment illustrated in FIG. 3D, the magnets 180 are disposed in the vent adapter 146 and the plugs 182 in the hose fitting 144. In other embodiments, alternating (or other arrangements of) magnets 180 and plugs 182 can be provided in each of the hose fitting 144 and vent adapter 146.

In at least some embodiments, the magnets 180 and plugs 182 (or magnets alone) can provide for an arrangement with quick attachment or detachment of the vent adapter 146 and the hose fitting 144. In at least some embodiments, the vent adapter 146 securely attached to the vent cap 160 of an air flow source, such as a vehicle ventilation system. Then, the hose fitting 144 can be quickly attached or detached from the air flow source using the arrangement of magnets 180/plugs 182. For example, when the electronic device 150 and dock 100 is removed from the vehicle, this quick attachment/detachment arrangement allow for faster and convenient removal.

The above specification provides a description of the manufacture and use of the invention. Since many embodiments of the invention can be made without departing from the spirit and scope of the invention, the invention also resides in the claims hereinafter appended.

What is claimed as new and desired to be protected by Letters Patent of the United States is:

1. A dock for an electronic device, the dock comprising:
 a base configured to fit over at least a portion of a back surface of the electronic device;

6 a tray extending from the base for receiving one side of the electronic device, wherein the tray comprises an opening through the tray;
 one or more contacts disposed in the tray and configured to electrically couple to contacts of the electronic device; and
 an air flow arrangement comprising
 a hose coupled, or coupleable, to the tray for air flow from the hose to pass through the opening in the tray, and
 a vent adapter coupled, or coupleable, to the hose and configured for coupling to a vent of an air flow source, wherein the dock is configured for directing air flow over the one or more contacts disposed in the tray for heating or cooling of the one or more contacts disposed in the tray.

2. The dock of claim 1, wherein the air flow arrangement further comprises a hose fitting coupling the hose to the vent adapter.

3. The dock of claim 2, wherein the air flow arrangement further comprises a plurality of magnets disposed in the hose fitting or vent adapter or both for magnetically coupling the hose fitting to the vent adapter.

4. The dock of claim 3, wherein the air flow arrangement further comprises a plurality of coupling elements made of a magnetic material and disposed in the hose fitting or vent adapter or both for magnetically coupling the hose fitting to the vent adapter.

5. The dock of claim 1, wherein the vent adapter comprises a shape complementary to vents of a specified vehicle or set of vehicles.

6. The dock of claim 1, wherein the air flow arrangement further comprises a tie or strap for coupling the vent adapter to the vent of the air flow source.

7. The dock of claim 1, wherein the air flow arrangement further comprises a dock connector for coupling the hose to the base of tray of the dock.

8. A system comprising:
 the dock of claim 1; and
 the electronic device.

9. The system of claim 8, further comprising a vehicle comprising a ventilation system configured to be the air flow source.

10. A method for cooling or heating an electronic device disposed in the dock of claim 1, the method comprising:
 providing a dock and an air flow arrangement coupled to the dock;
 coupling the vent adapter to a vent of an air flow source; and
 operating the air flow source to direct cool air or warm air through the hose to the dock to, respectively, cool or heat the electronic device.

11. The method of claim 10, wherein the air flow source is a ventilation system of a vehicle.

12. The method of claim 10, wherein the air flow arrangement further comprises a hose fitting coupled to the hose, the method further comprising coupling the hose to the vent adapter using the hose fitting.

13. The method of claim 12, wherein the air flow arrangement further comprises a plurality of magnets disposed in the hose fitting or vent adapter or both, wherein coupling the hose to the vent adapter using the hose fitting comprises magnetically coupling the hose fitting to the vent adapter using the magnets.

14. The method of claim 13, wherein the air flow arrangement further comprises a plurality of coupling elements made of a magnetic material and disposed in the hose fitting or vent adapter or both, wherein the magnetically coupling comprises magnetically coupling the hose fitting to the vent adapter using the magnets and the coupling elements.

15. The method of claim 10, wherein the providing comprises coupling the air flow arrangement to the dock.

16. The method of claim 10, wherein the coupling comprises attaching the vent adapter to the vent using at least one tie or strap.

17. The method of claim 10, further comprising decoupling the hose from the vent adapter.

18. The dock of claim 1, wherein the dock is configured for directing air flow over the contacts of the electronic device, when received in the dock, for heating or cooling of the contacts of the electronic device.

\* \* \* \* \*